US006534814B2

(12) United States Patent
Iba et al.

(10) Patent No.: US 6,534,814 B2
(45) Date of Patent: *Mar. 18, 2003

(54) METHOD OF MANUFACTURING A SEMICONDUCTOR MEMORY DEVICE HAVING A TRENCH CAPACITOR WITH SUFFICIENT CAPACITANCE AND SMALL JUNCTION LEAK CURRENT

(75) Inventors: Junichiro Iba, Wappingers Falls, NY (US); Yusuke Kohyama, Yokosuka (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/497,690

(22) Filed: Feb. 4, 2000

(65) Prior Publication Data
US 2002/0072183 A1 Jun. 13, 2002

Related U.S. Application Data

(63) Continuation of application No. 08/825,993, filed on Apr. 4, 1997, now Pat. No. 6,100,130, which is a division of application No. 08/715,490, filed on Sep. 18, 1996, now abandoned, which is a continuation of application No. 08/305,665, filed on Sep. 14, 1994, now abandoned.

(30) Foreign Application Priority Data

Sep. 16, 1993 (JP) .............................. 5-229956

(51) Int. Cl.[7] ................ H01L 27/108; H01L 29/94
(52) U.S. Cl. ........................ 257/304; 257/532
(58) Field of Search ...................... 257/301–305, 257/296, 311, 532; 438/243–249, 386–392, 238, 239, 381

(56) References Cited

U.S. PATENT DOCUMENTS 4,792,834 A  12/1988  Uchida ............... 257/304

(List continued on next page.)

FOREIGN PATENT DOCUMENTS

| EP | 0 234 891 | 9/1987 |
| EP | 0 287 056 | 10/1988 |
| JP | 62-208659 | 9/1987 |
| JP | 1-192157 | 8/1989 |
| JP | 2-9166 | 1/1990 |
| JP | 02-005467 | 1/1990 |
| JP | 02-128466 | 5/1990 |
| JP | 05-013707 | 1/1993 |
| JP | 05-063155 | 3/1993 |
| JP | 05067749 | * 3/1993 ............... 257/301 |

OTHER PUBLICATIONS

Japanese Patent Office, Office Action, Nov. 13, 2001, pp. 1–7, Mailing No. 296444.

Toru Kaga et al; IEEE Transactions on Electron Devices, dated Aug. 8, 1988, vol. 35, No. 8, "Half–$V_{cc}$ Sheath–Plate Capacitor DRAM Cell With Self–Aligned Buried Plate Wiring" pp. 1257–1263.

Primary Examiner—Eddie Lee
Assistant Examiner—Marcos D. Pizarro-Crespo
(74) Attorney, Agent, or Firm—Banner & Witcoff, Ltd.

(57) ABSTRACT

The invention provides a structure which enables a junction leak current to be reduced without reducing a capacitor area. A trench is formed in the surface of a substrate such that it is connected to a conductive region for a transistor. The structure is characterized by comprising a capacitor electrode formed on the inner peripheral surface of the trench and having its upper edge portion located below the conductive region, an insulating layer projecting inward of the trench at least from the upper edge portion of the capacitor electrode to the conductive region, thereby narrowing the diameter of the trench, a capacitor insulating film coated on the capacitor electrode, and a capacitor electrode filling the trench and contacting the capacitor insulating film.

25 Claims, 11 Drawing Sheets

U.S. PATENT DOCUMENTS

| | | | |
|---|---|---|---|
| 4,794,434 A | | 12/1988 | Pelley, III .................. 357/23.6 |
| 4,801,988 A | * | 1/1989 | Kenney ...................... 257/304 |
| 4,918,502 A | * | 4/1990 | Kaga et al. ................. 257/304 |
| 4,918,503 A | * | 4/1990 | Okuyama .................. 257/301 |
| 4,967,248 A | | 10/1990 | Shimizu .................... 357/23.6 |
| 5,017,506 A | * | 5/1991 | Shen et al. ................. 438/386 |
| 5,309,008 A | | 5/1994 | Watanabe ................... 257/301 |
| 5,336,912 A | * | 8/1994 | Ohtsuki ...................... 257/304 |
| 5,422,294 A | * | 6/1995 | Noble, Jr. ................... 438/246 |
| 5,482,883 A | | 1/1996 | Rajeevakumar |

\* cited by examiner

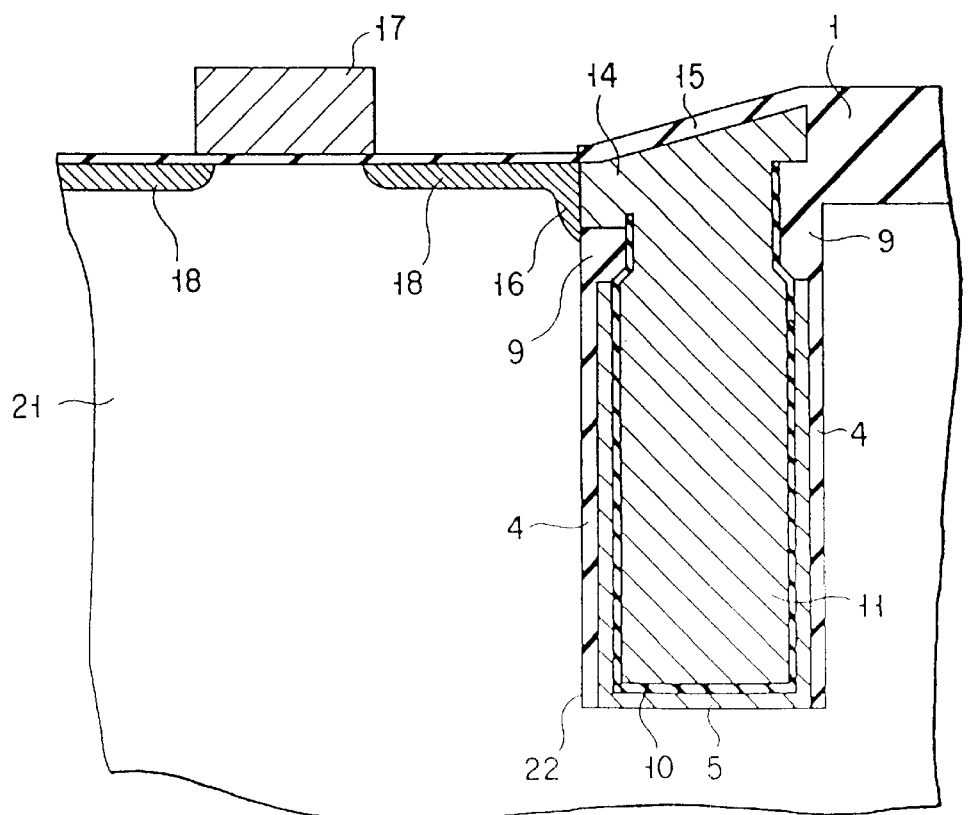
F I G. 2

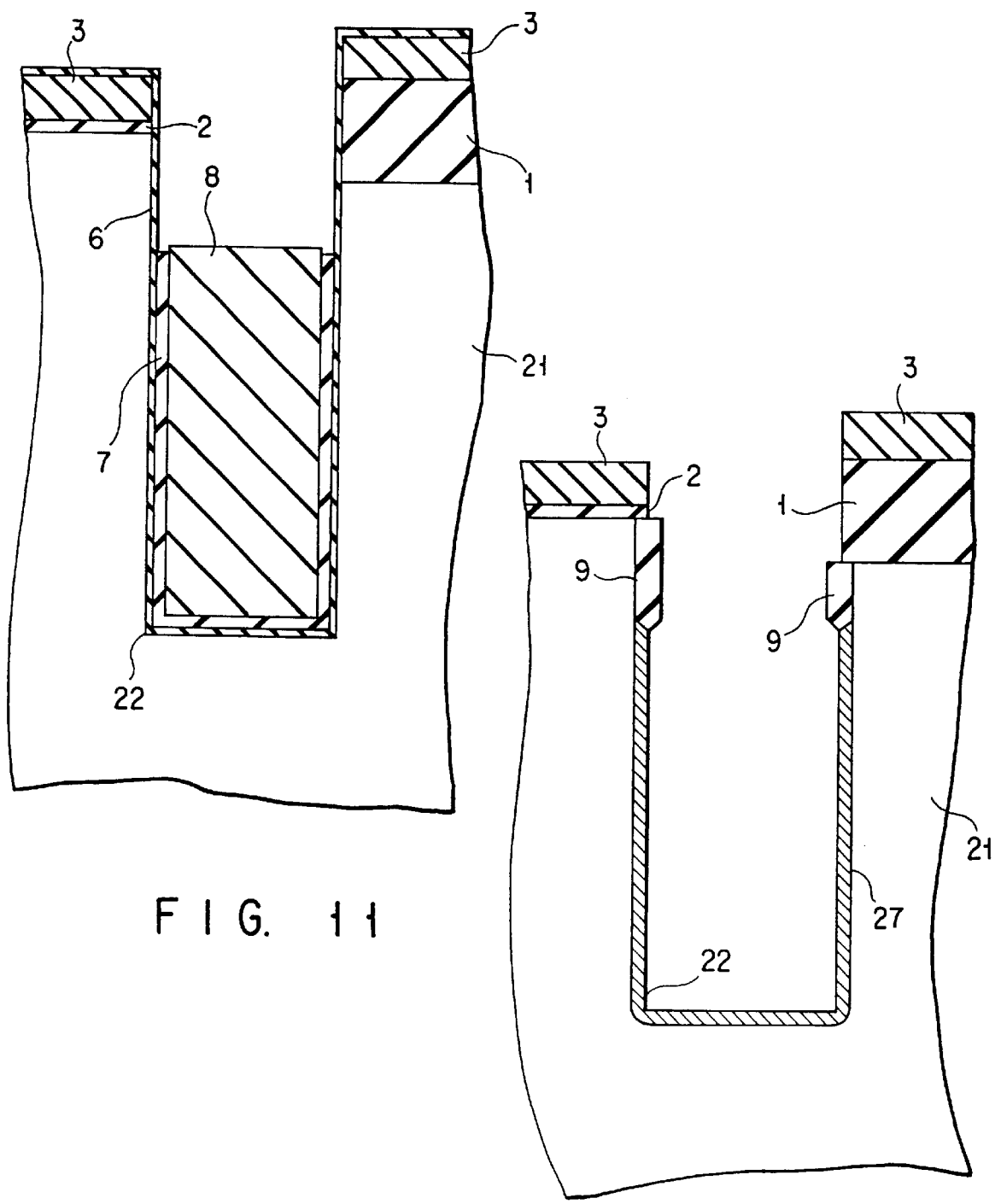
F I G. 11
F I G. 12

METHOD OF MANUFACTURING A SEMICONDUCTOR MEMORY DEVICE HAVING A TRENCH CAPACITOR WITH SUFFICIENT CAPACITANCE AND SMALL JUNCTION LEAK CURRENT

This application is a continuation of U.S. application Ser. No. 08/825,993, filed Apr. 4, 1997, now U.S. Pat. No. 6,100,130 issued Aug. 8, 2000, which is a divisional of U.S. application Ser. No. 08/715,490, filed on Sep. 18, 1996, now abandoned; which is a continuation of U.S. application Ser. No. 08/305,665, filed on Sep. 14, 1994, now abandoned.

BACKGROUND OF THE INVENTION

1. Field of the Invention

This invention relates to a semiconductor device, more particularly to a trench capacitor structure of a DRAM (Dynamic Random Access Memory), and also to a method for manufacturing the structure.

2. Description of the Related Art

An example of a DRAM having a sheath-plate type trench capacitor is known from "Half-Vcc Sheath-Plate Capacitor DRAM Cell with Self-Aligned Buried Plate Wiring" published in IEEE TRANSACTIONS ON ELECTRON DEVICES, VOL. 35, NO. 8, August 1988, and written by Toru KAGA, Yoshifumi KAWAMOTO, Tokuo KURE, Yoshinobu NAKAGOME, Masakazu AOKI, Hideo SUNAMI, Tohachi MAKINO, Nagatoshi OHKI and Kiyoo ITOH.

FIG. 1 is a cross sectional view, showing a conventional sheath-plate type trench capacitor. As is shown in FIG. 1, a trench is formed in a semiconductor substrate 21 in contact with a field oxide film 1. An area which includes a trench inner wall oxide film 4, a silicon oxide/silicon nitride ($SiO_2$/SiN) film 10, a polysilicon film 14, a diffusion layer 16 and part of the substrate 21 serves as a gate control diode. When a potential has been applied to the polysilicon film 14 (or to a polysilicon film 11 formed in a deep portion of the trench), a depletion layer grows in the vicinity of a peripheral portion of the trench-inner-wall oxide film 4, thereby forming an inversion layer such that it extends from the diffusion layer 16 along the outer periphery of the trench. As a result, the amount of a junction leak current between the substrate 21 and the diffusion layer 16 contacting the polysilicon film 14 increases.

To reduce the influence of the potential applied to the polysilicon films 11 and 14, it is necessary to make the oxide film 4 thick. However, increasing the thickness of the oxide film 4 inevitably reduces the area of a capacitor insulating film and hence the capacitance of the trench capacitor.

In the conventional structure, the potential applied to the polysilicon film filled in the trench increases the junction leak current between the substrate and the diffusion layer contacting the polysilicon film. To avoid this, it is necessary to reduce the capacitance of the capacitor to some extent. Actually, however, the capacitance is excessively reduced since an increase in junction leak current is prevented by increasing the thickness of the trench inner wall oxide film.

SUMMARY OF THE INVENTION

It is the object of the invention to provide a highly reliable semiconductor device having a sufficient trench capacitor capacitance and a small junction leak current, and also provide a method for manufacturing the semiconductor device.

According to an aspect of the invention, there is provided a semiconductor device constituting a DRAM having a trench capacitor, comprising:

a semiconductor substrate of a first conductivity type;

a conductive region of a second conductivity type formed in a surface portion of the semiconductor substrate;

a trench formed in a surface portion of the semiconductor substrate, adjacent to the conductive region;

a first capacitor electrode formed on an inner peripheral surface of the trench and having an upper edge portion located below the conductive region;

an insulating layer having a portion which extends from the upper edge portion of the first capacitor electrode to the conductive region and projects inward of the trench and narrows the diameter of the trench;

a capacitor insulating film coated on the first capacitor electrode; and a second capacitor electrode filling the trench such that it contacts the capacitor insulating film and is electrically connected to the conductive region.

According to another aspect of the invention, there is provided a method of manufacturing a semiconductor device constituting a DRAM having a trench capacitor, comprising the steps of:

forming in a semiconductor substrate a trench having a wall surface to be able to be oxidized;

coating a material with an oxidation resistance on the wall surface of the trench except for an upper edge portion thereof; and oxidizing the upper edge portion of the trench, thereby selectively forming an insulating layer projecting inward of the trench.

In the invention constructed as above, that portion of the insulating layer, which extends from the upper edge portion of the first capacitor electrode to the conductive region and in which junction leak can easily occur, is formed thick such that it projects inward of the trench, thereby interrupting at that portion continuous formation of an inversion layer extending along the outside of the trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross sectional view, showing a trench capacitor employed in a DRAM according to a first embodiment of the invention;

FIG. 11 is a cross sectional view, showing a step for obtaining a structure shown in FIG. 12;

FIG. 12 is a cross sectional view, showing essential part of a sheath-plate type trench capacitor employed in a DRAM according to a third embodiment of the invention;

DETAILED DESCRIPTION OF THE PREFERRED EMBODIMENTS

Figure 1:
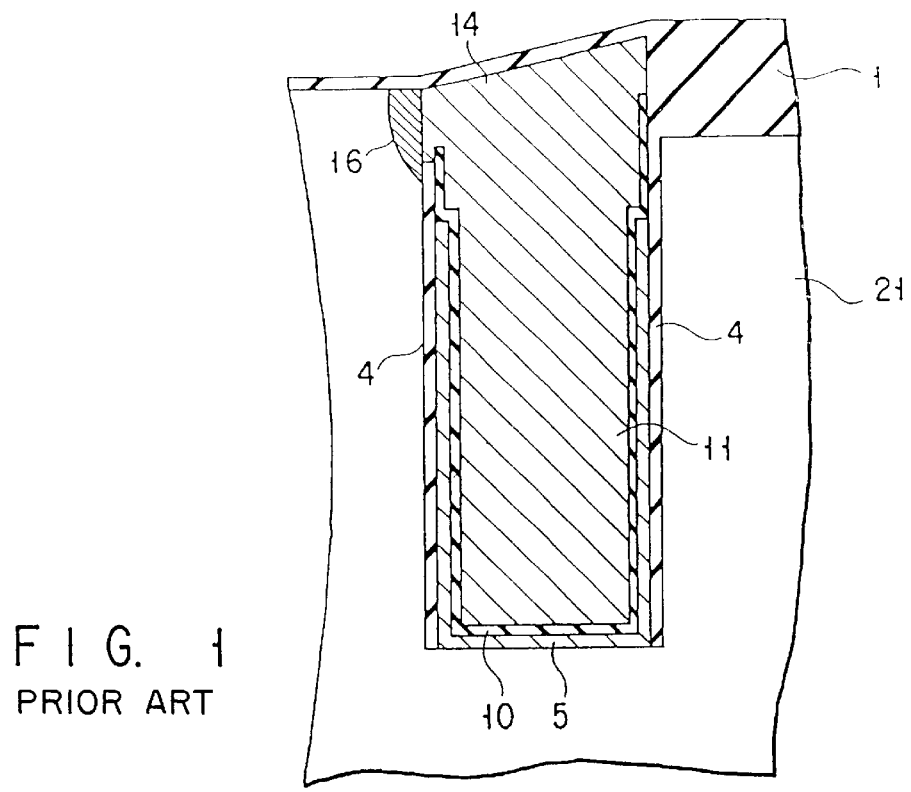
FIG. 1 is a cross sectional view, showing a conventional sheath-plate type trench capacitor.

FIG. 2 is a cross sectional view, showing a trench capacitor employed in a DRAM according to a first embodiment of the invention. As is shown in FIG. 2, the source/drain regions 18 of a memory cell transistor (MOS transistor) are formed in the p-type surface of a monocrystal silicon semiconductor substrate 21. Reference numeral 17 denotes the gate electrode of the transistor. A trench 22 is formed in a portion of the substrate 21 adjacent to one of the source/drain regions 18. A polysilicon film 5 is formed in an inner peripheral portion of the trench 22. The film 5 has an upper edge portion located below the source/drain region 18, and serves as a first capacitor electrode. A $SiO_2$ film 9 extends from the upper edge portion of the film 5 to the source/drain region 18 such that it projects inward, thereby reducing the diameter of the trench 22. A $SiO_2$ film 4 having a thickness thinner than the film 9 extends therefrom and covers the inner periphery of the trench 22. A $SiO_2$/SiN film 10 covers the polysilicon film 5 and serves as a capacitor insulating film. A polysilicon film 11 which serves as a second capacitor electrode is filled in the trench 22 such that it contacts the $SiO_2$/SiN film 10 and the drain region 18.

Figures 3, 4:
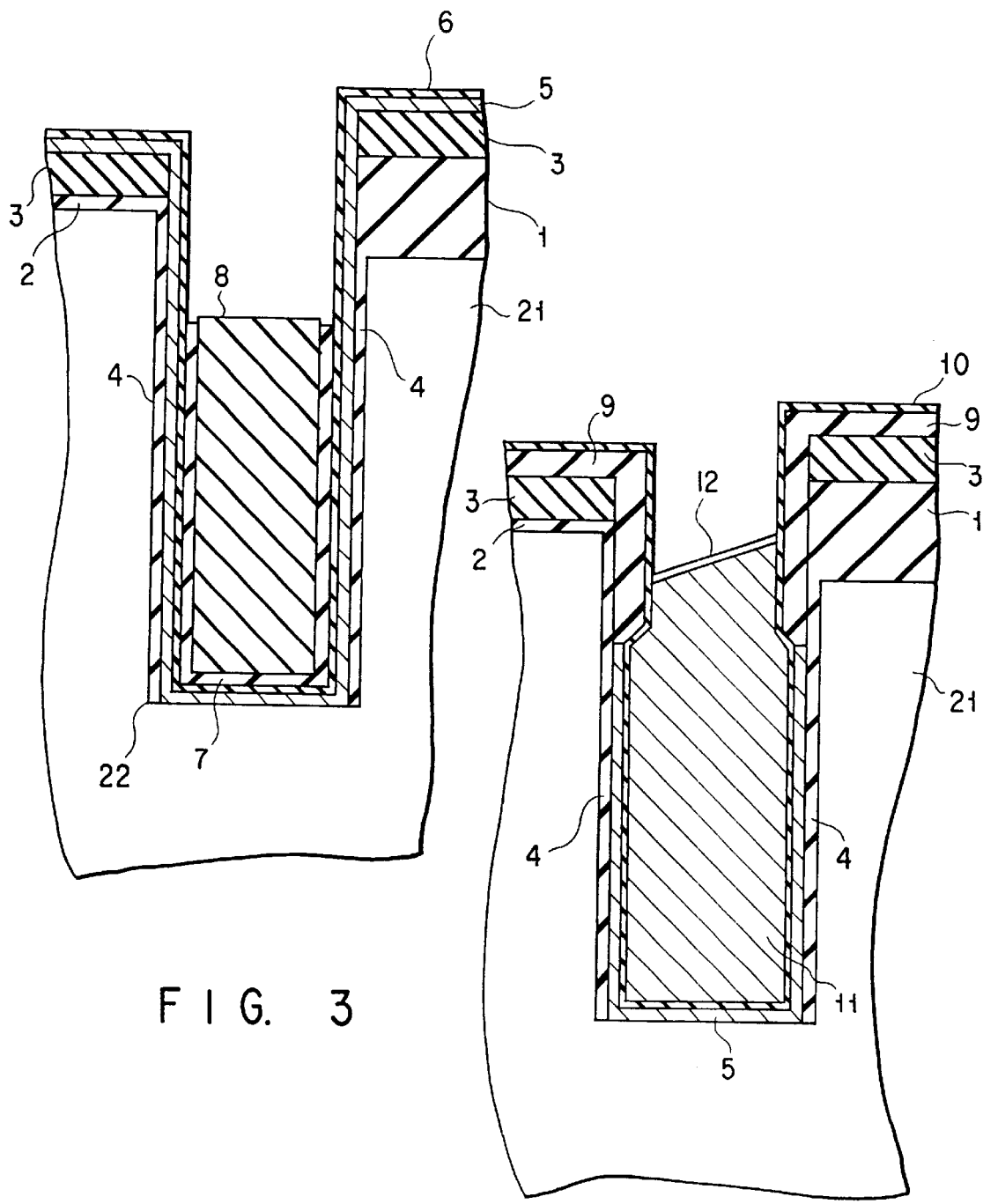
FIGS. 3–6 are views, useful in explaining essential steps of a method for forming the structure shown in FIG. 2.

FIGS. 3–6 are views, useful in explaining essential steps of a method for forming the sheath-plate type trench capacitor shown in FIG. 2. Referring first to FIG. 3, the trench 22 which has a depth of 5 $\mu$m and a diameter of 0.5 $\mu$m is formed in the p-type surface region of the monocrystal silicon substrate 21 which is adjacent to the field oxide film 1, using a SiN film 3 as a mask. Then, the $SiO_2$ film 4, which has a thickness of 20 nm, is formed on the inner periphery of the trench 22 by oxidation at high temperature. That part of the $SiO_2$ film 4 which is fqrmed on the bottom of the trench 22 is selectively etched by unisotropic etching. Subsequently, the polysilicon film 5 with a thickness of 50 nm, a SiN film 6 with a thickness of 12 nm and a $SiO_2$ film 7 with a thickness of 50 nm are deposited in this order by the CVD method. The polysilicon film 5 serving as a capacitor electrode is doped with phosphorus of high density while or after the film 5 is formed. Thereafter, an exposed portion of the $SiO_2$ film 7 is removed by a buffer HF aqueous solution, using as a mask a resist layer 8 having a thickness of 3 $\mu$m and formed on the bottom of the trench.

Then, as is shown in FIG. 4, the resist layer 8 is removed, and an exposed portion of the SiN film 6 is removed by a hot $H_3PO_4$ aqueous solution, using as a mask the $SiO_2$ film 7 shown in FIG. 3. Subsequently, the $SiO_2$ film 7 is removed by a buffer HF aqueous solution. The resultant structure is subjected to a high temperature thermal oxidation treatment, thereby oxidizing a shallow portion of the trench exposed after removing the SiN film 6, i.e., an upper edge portion of the polysilicon film 5. As a result, a $SiO_2$ film 9 having a thickness of 50 nm is formed. The remaining SiN film 6 is removed by the hot $H_3PO_4$ aqueous solution. The polysilicon film 5 may be doped in this stage. Then, a SiN film (10) having a thickness of 10 nm is deposited by the CVD method, and a surface portion thereof is oxidized by high temperature oxidation, thereby forming a capacitor insulating film 10 of high quality. Alternatively, the SiN film 6 may not be removed after forming the $SiO_2$ film 9, and used as the capacitor insulating film. Subsequently, a polysilicon film 11 having a thickness of 400 nm is formed in the trench by the CVD method, thereby almost completely filling the trench. The film 11 thus formed serves as another capacitor electrode. As in the case of the polysilicon film 5, phosphorus is injected into the polysilicon film 11. Thereafter, the polysilicon film 11 is selectively etched back by isotropic dry etching to have a thickness of 4 $\mu$m from the bottom of the trench. Then, a surface portion of the polysilicon film 11 is oxidized by high temperature oxidation, forming a $SiO_2$ film 12 with a thickness of 10 nm.

Figure 5:
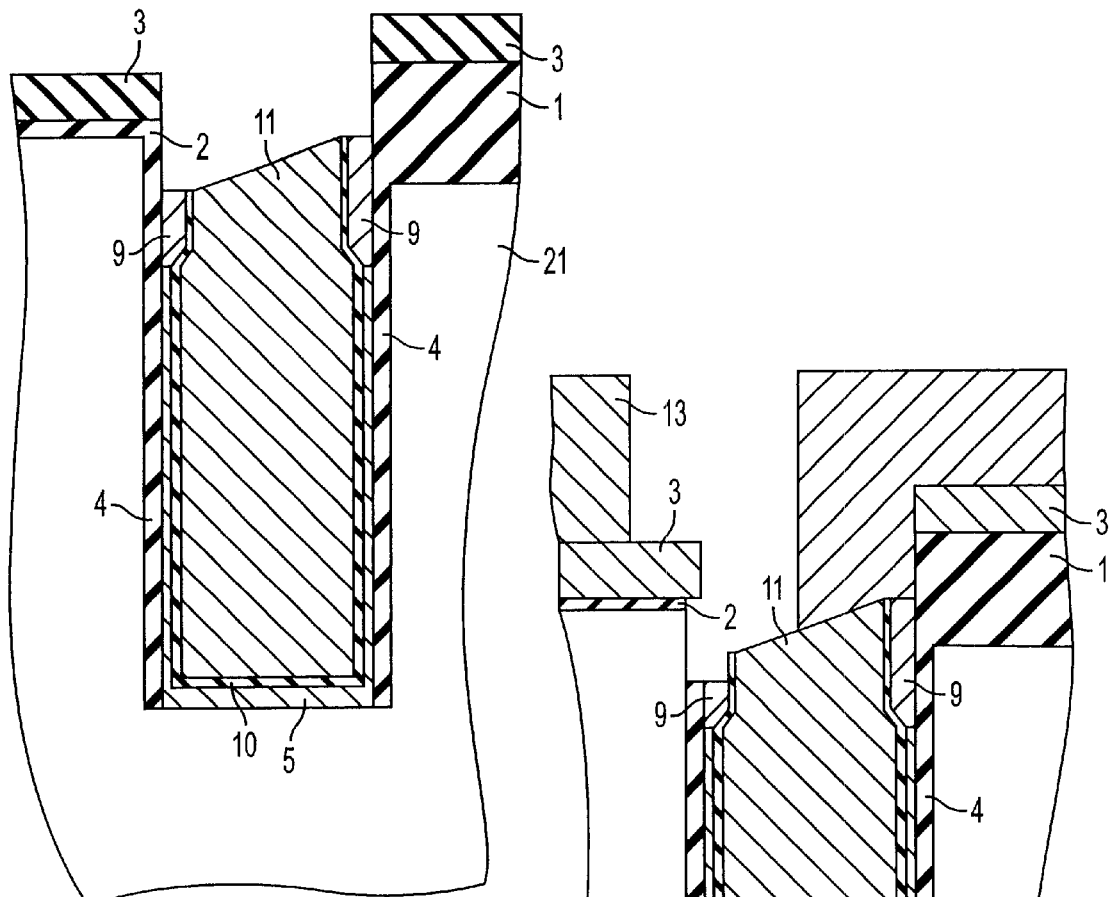

Then, as is shown in FIG. 5, an exposed portion of the $SiO_2$/SiN film 10 is selectively etched by the isotropic dry etching. Subsequently, that surface portion of the $SiO_2$ film 9 which extends to the upper surface of the polysilicon film 11 is selectively removed by unisotropic etching, together with the $SiO_2$ film 12.

Figure 6:
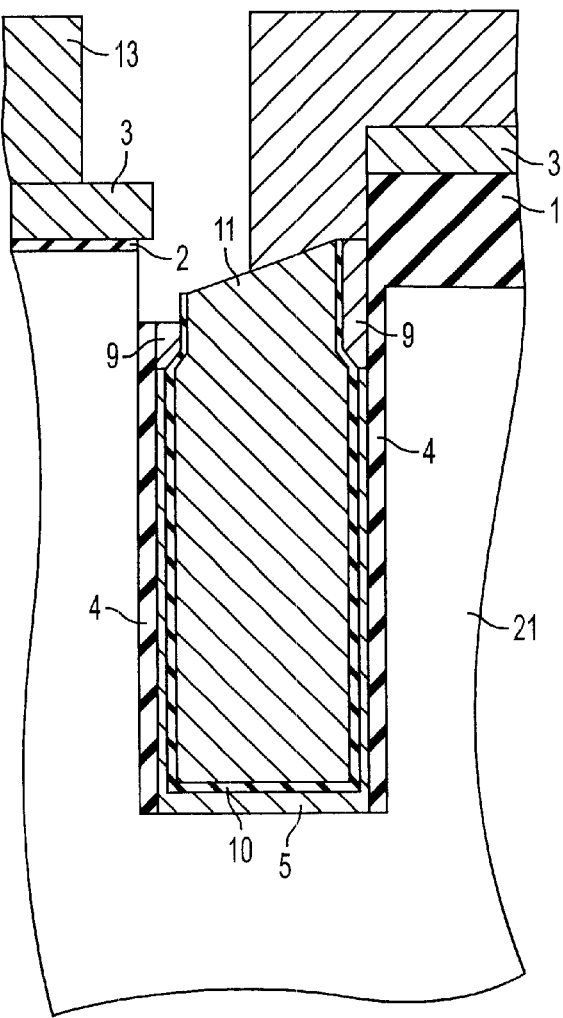

Thereafter, as is shown in FIG. 6, the resultant structure is coated with a resist layer 13, an opening is formed by a lithography technique to expose a portion of the trench, and the side wall oxide film 4 is removed by the use of the buffer HF aqueous solution. Thereafter, a structure as shown in FIG. 2 is obtained. Specifically, the resist layer 13 is removed, a highly doped polysilicon film 14 is filled in the trench, and that portion of the polysilicon film 14 which extends from the surface to the lower end of the SiN film 3 is removed by the isotropic dry etching. Then, a surface portion of the polysilicon film 14 is oxidized by thermal oxidation, thereby forming a $SiO_2$ film 15 with a thickness of 30 nm. Phosphorus or arsenic injected in the polysilicon film 14 is diffused to the outside of the trench, thereby forming a diffusion layer 16. Subsequently, the SiN film 3 is selectively etched by the isotropic dry etching. Thereafter, a memory cell of the DRAM is formed by a known technique. Specifically, a gate electrode 17 is selectively formed on the $SiO_2$ film 15, and source/drain regions 18 one of which contacts the diffusion layer 16 are formed (FIG. 2).

In the above-described embodiment, the $SiO_2$ film 9 which is located just below the diffusion layer 16 connecting the polysilicon film 14 to the substrate 21 (in other words, the film 9 which extends from an upper edge portion of the polysilicon film 5 serving as a capacitor electrode, to the diffusion layer 16), and in which junction leak will occur, is formed to have a thickness thicker than the $SiO_2$ film 4 which extends to the bottom of the trench. As a result, an inversion layer along the outside of the trench is hard to form in the vicinity of the film 9. This means that the thick $SiO_2$ film 9 prevents an inversion layer formed along the outside of the trench from being connected to the diffusion layer 16 by the influence of a potential applied to the polysilicon film 14 (or 11). Further, since in the embodiment, only the $SiO_2$ film 9 is formed thick and the substantial area of the capacitor located under the film 9 is not reduced, the amount of the junction leak can be restrained without reducing the capacitance of the trench capacitor.

Figure 7:
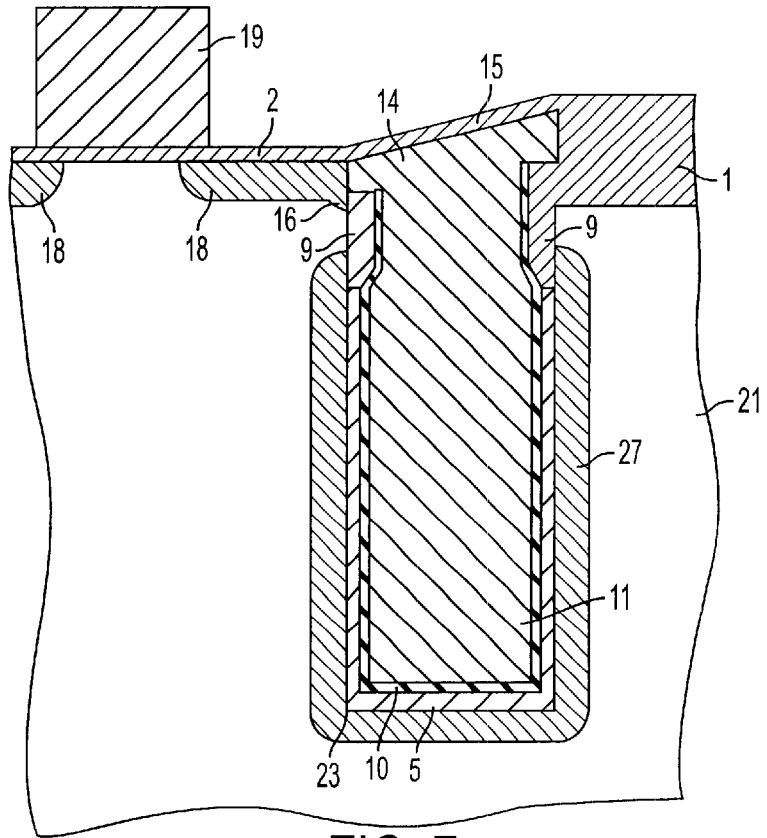
FIG. 7 is a cross sectional view, showing a trench capacitor employed in a DRAM according to a second embodiment of the invention.

FIG. 7 is a cross sectional view, showing a sheath-plate type trench capacitor employed in a DRAM according to a second embodiment of the invention. As is shown in FIG. 7, source/drain regions 18 for a memory cell transistor (MOS transistor) are formed in the p-type surface of the monocrystal silicon semiconductor substrate 21. Reference numeral 19 denotes a gate electrode for the transistor. A trench 23 is formed in that portion of the substrate 21 which is located adjacent to one of the source/drain regions 18, and a polysilicon film 5 serving as a first capacitor electrode is formed on the inner peripheral wall and the bottom of the trench 23 such that an upper edge portion thereof is located below the source/drain region 18. A thick $SiO_2$ film 9 projects inward from the peripheral wall of the trench such that it narrows the diameter of the trench 23 in an area ranging from the upper edge portion of the polysilicon film 5 to the source/drain region 18. Reference numeral 27 denotes a diffusion layer formed around the trench 23 as a result of diffusion of an impurity injected in the polysilicon film 5. A $SiO_2$/SiN film 10 serving as a capacitor insulating film is formed on the polysilicon film 5. A polysilicon film 11 serving as a second capacitor electrode is filled in the trench 23 such that it contacts the $SiO_2$/SiN film 10 and also the drain region 18.

Figure 8:
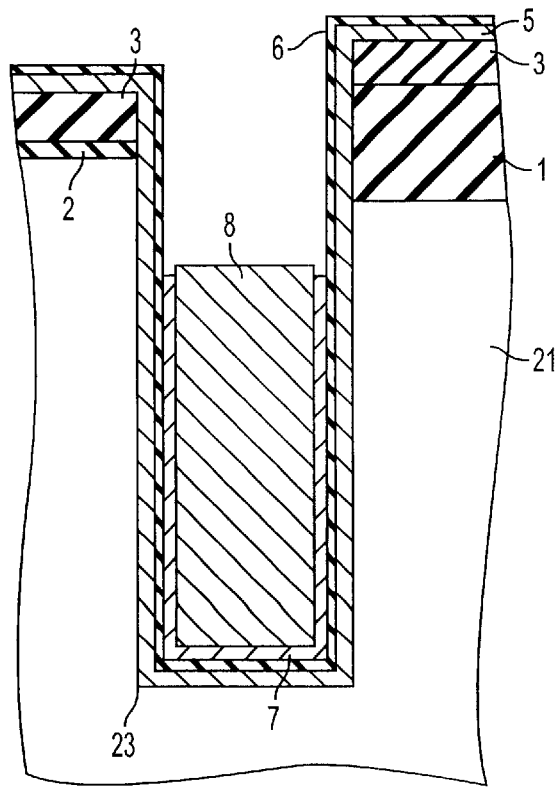
FIGS. 8–10 are views, useful in explaining essential steps of a method for forming the structure shown in FIG. 7.
Figures 9, 10:
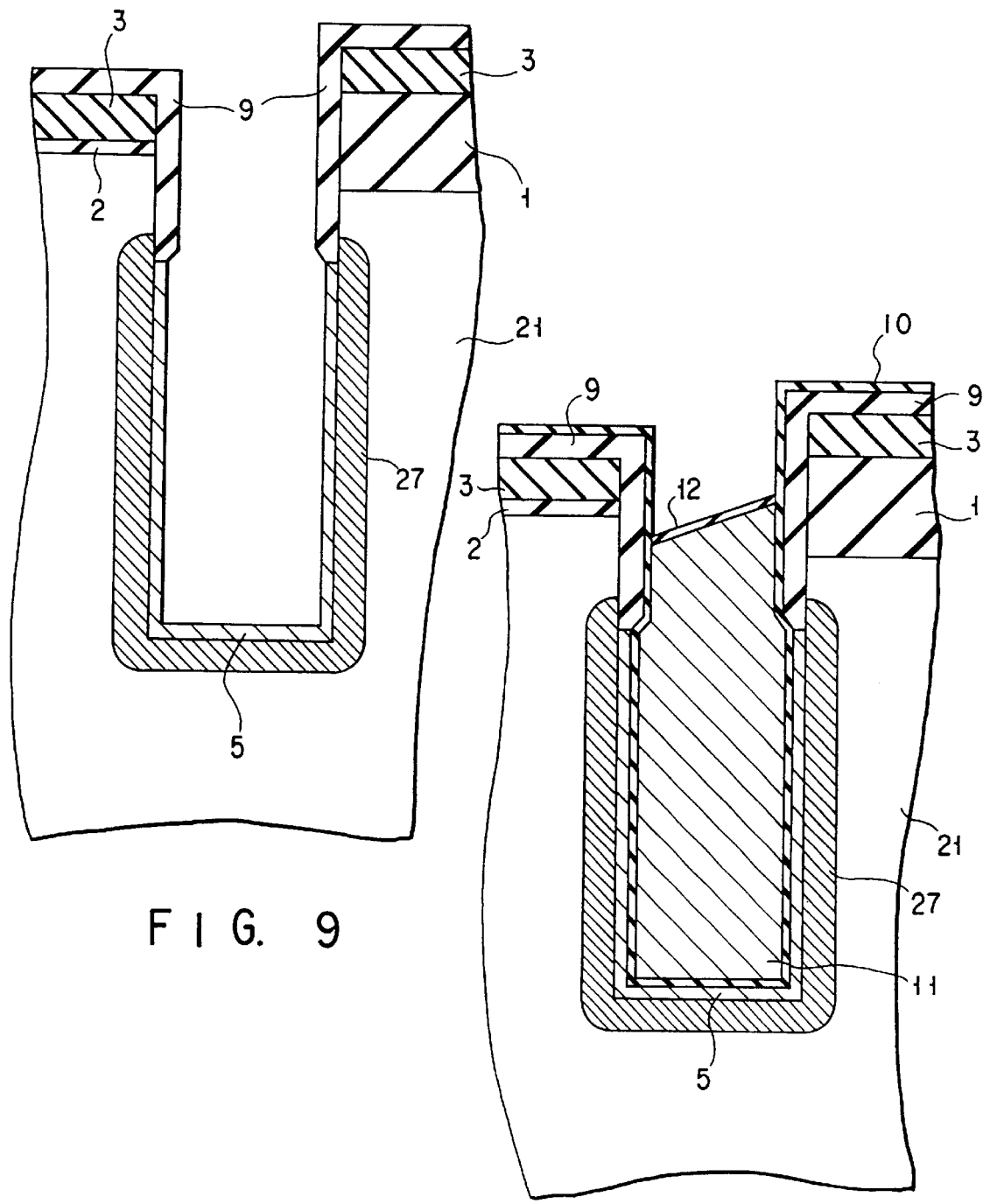

FIGS. 8–10 are views, useful in explaining essential steps of a method for forming the structure shown in FIG. 7. Elements similar to those in the first embodiment are denoted by corresponding reference numerals. As is shown in FIG. 8, a trench 23 having a depth of 5 $\mu$m is formed in the p-type surface of a monocrystal silicon substrate 21. Then, a polysilicon film 5 having a thickness of 60 nm, a SiN film 6 having a thickness of 12 nm and a $SiO_2$ film 7 having a thickness of 50 nm are deposited by the CVD method in this order. Subsequently, an exposed portion of the $SiO_2$ film 7 is removed by a buffer HF aqueous solution, using as a mask a resist layer 8 having a thickness of 3 $\mu$m and formed on the bottom of the trench.

Then, as is shown in FIG. 9, the resist layer 8 is removed, and an exposed portion of a SiN film 6 is removed by a hot $H_3PO_4$ aqueous solution, using as a mask the $SiO_2$ film 7. Subsequently, the $SiO_2$ film 7 is removed by the buffer HF aqueous solution. At this time, only that portion of the SiN film 6 having been located under the $SiO_2$ film remains. Then, that exposed portion of the polysilicon film 5 on which the SiN film 6 does not remain is oxidized by thermal oxidation, thereby forming a $SiO_2$ film 9 with a thickness of 50 nm. The SiN film 6 is removed by the hot $H_3PO_4$ aqueous solution. The polysilicon film 5 may be doped with phosphorus or arsenic of high density in this stage. Phosphorus or arsenic is diffused from the polysilicon film 5 to the outside of the trench, thereby forming a diffusion layer 27.

Then, as is shown in FIG. 10, a SiN film (10) having a thickness of 10 nm is deposited by the CVD method, and a thin surface portion thereof is oxidized by high temperature oxidation, thereby forming a capacitor insulating film 10 of high quality. Alternatively, the SiN film 6 may not be removed after forming the $SiO_2$ film 9, and used as the capacitor insulating film. Subsequently, a polysilicon film 11 having a thickness of 400 nm is formed in the trench by the low pressure CVD method such that it almost completely fills the trench. As in the case of the polysilicon film 5, phosphorus is injected into the polysilicon film 11. Thereafter, the polysilicon film 11 is selectively etched back by isotropic dry etching to have a thickness of 4.5 $\mu$m from the bottom of the trench. Then, a surface portion of the polysilicon film 11 is oxidized by high temperature oxidation, thereby forming a $SiO_2$ film 12 with a thickness of 10 nm. Thereafter, a memory cell of the DRAM shown in FIG. 7 is formed in a process similar to that employed in the first embodiment. Specifically, the trench is filled with a polysilicon film 14, a surface portion of the polysilicon film 14 is oxidized (thereby forming a $SiO_2$ film 15), a gate electrode 19 is selectively formed on the $SiO_2$ film 2, and source/drain regions 18 are formed such that one of the regions 18 contacts the diffusion layer 16.

FIG. 12 is a cross sectional view, showing essential part of a sheath-plate type trench capacitor employed in a DRAM according to a third embodiment of the invention. FIG. 11 is a cross sectional view, showing a step for obtaining the structure shown in FIG. 12. Elements similar to those employed in the first or second embodiment are denoted by corresponding reference numerals. Referring to FIG. 11, a trench 22 with a depth of 5 $\mu$m and a diameter of 0.5 $\mu$m is formed in the p-type surface of a monocrystal silicon substrate 21. Then, a SiN film 6 with a thickness of 12 nm and a $SiO_2$ film 7 with a thickness of 50 nm are deposited in this order by the CVD method. Subsequently, the $SiO_2$ film 7 is removed by a buffer HF aqueous solution, using as a mask a resist layer 8 having a thickness of 3 $\mu$m and formed on the bottom of the trench 22.

Then, as is shown in FIG. 12, the resist layer 8 is removed, and an exposed portion of the SiN film 6 is removed by a hot $H_3PO_4$ aqueous solution, using as a mask the $SiO_2$ film 7. Subsequently, the $SiO_2$ film 7 is removed by a buffer HF aqueous solution. Then, that portion of the silicon substrate which has been exposed after removing the SiN film 6 is subjected to high temperature oxidation, thereby forming a $SiO_2$ film 9 having a thickness of 50 nm. The $SiO_2$ film 9 is then removed by the hot $H_3PO_4$ aqueous solution. Subsequently, an exposed portion of the substrate in the trench is doped with phosphorus or arsenic of high density to form a diffusion layer 27. Thereafter, as in the case of FIG. 10, a SiN film (10) with a thickness of 10 nm is deposited by the CVD method, a shallow surface portion thereof is oxidized, thereby obtaining capacitor insulating film 10 of high quality. Thereafter, a memory cell of the DRAM can be formed in a process similar to that employed in the first or second embodiment.

Figure 13:
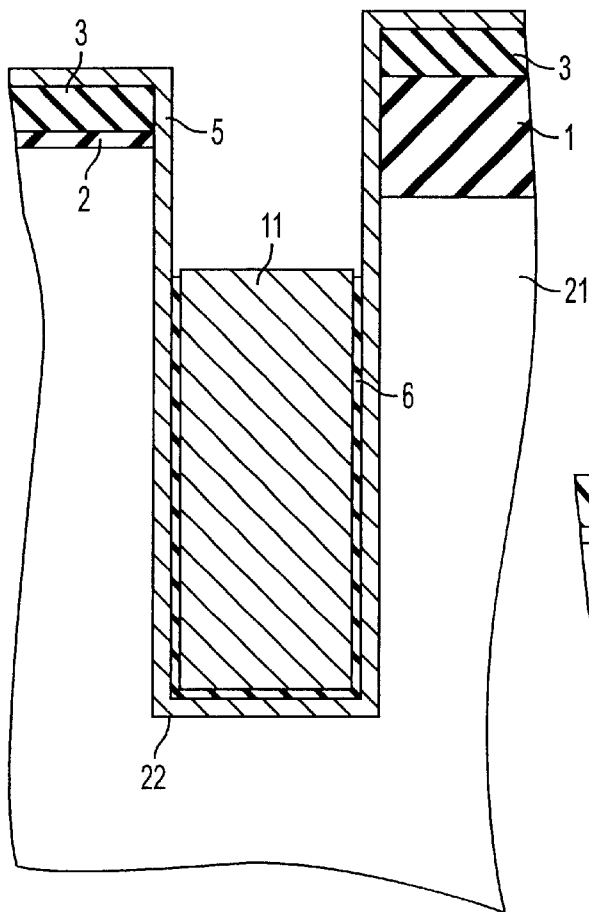
FIG. 13 is a cross sectional view, showing a step for obtaining a structure shown in FIG. 14.
Figure 14:
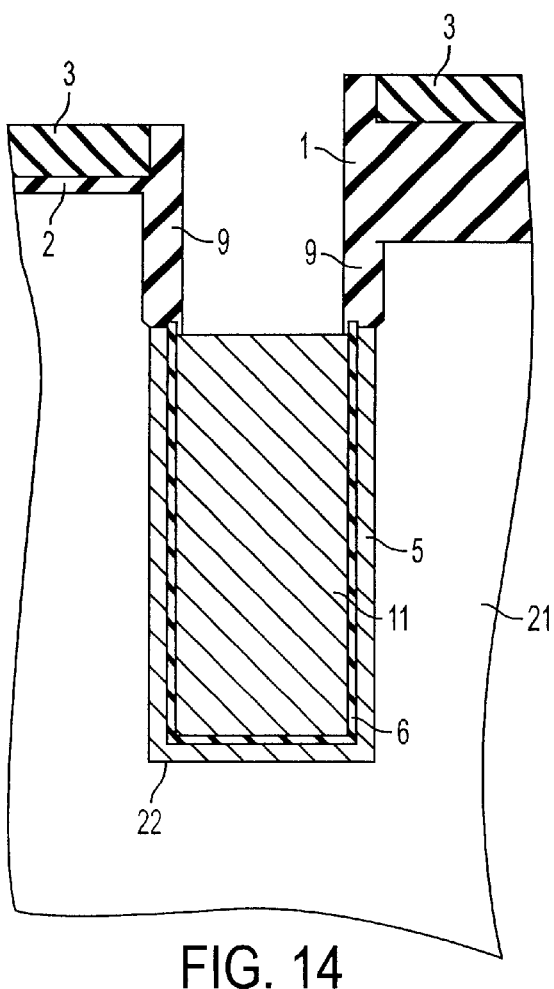
FIG. 14 is a cross sectional view, showing essential part of a sheath-plate type trench capacitor employed in a DRAM according to a fourth embodiment of the invention.

FIG. 14 is a cross sectional view, showing essential part of a sheath-plate type trench capacitor employed in a DRAM according to a fourth embodiment of the invention, while FIG. 13 is a cross sectional view, showing a step for obtaining the structure shown in FIG. 14. Elements similar to those employed in the first embodiment are denoted by corresponding reference numerals. Referring to FIG. 13, a trench 22 with a depth of 5 $\mu$m and a diameter of 0.5 $\mu$m is formed in the p-type surface of a monocrystal silicon substrate 21. Then, a polysilicon film 5 with a thickness of 60 nm and a SiN film 6 with a thickness of 12 nm are deposited in this order by the CVD method. The polysilicon film 5 is doped with phosphorous or arsenic of high quality while or after it is formed. Phosphorous or arsenic injected in the film 5 diffuses into the substrate in a heating step performed later. Subsequently, a shallow surface portion of the SiN film 6 is oxidized, and a polysilicon film 11 with a thickness of 400 nm is deposited in the trench 22 by the CVD method. Then, polysilicon film 11 is selectively etched back by isotropic dry etching to have a thickness of 3 µm from the bottom of the trench, and en exposed portion of the SiN film 6 is removed by the use of a hot $H_3PO_4$ aqueous solution.

Subsequently, as is shown in FIG. 14, an exposed portion of the polysilicon film 5 is completely oxidized by high temperature oxidation, forming a $SiO_2$ film 9. At the same time as the oxidation of the polysilicon film 5, part of the substrate may be oxidized. An upper surface portion of the polysilicon film 11 is oxidized, thereby forming a $SiO_2$ film 12 (not shown). Then, that portion of the $SiO_2$ film 9 which extends to the upper surface of the polysilicon film 11 is removed by unisotropic etching. The $SiO_2$ film 12 is removed together with the $SiO_2$ film 9. Thereafter, a memory cell of the DRAM can be formed in the same process as employed in the second embodiment.

The second through fourth embodiments can provide the same advantage as obtained by the first embodiment. That is, in the sheath-plate type trench capacitor structure, the portion of an oxide film which extends from an upper edge portion of a capacitor electrode formed on the trench inner wall to the conductive region (drain region 18) of the transistor is formed thick such that it projects inward of the trench, so as to prevent that portion from changing to an inversion layer. Therefore, a junction leak current can be reduced without reducing a substantial area of the capacitor located below that portion.

Figure 15:
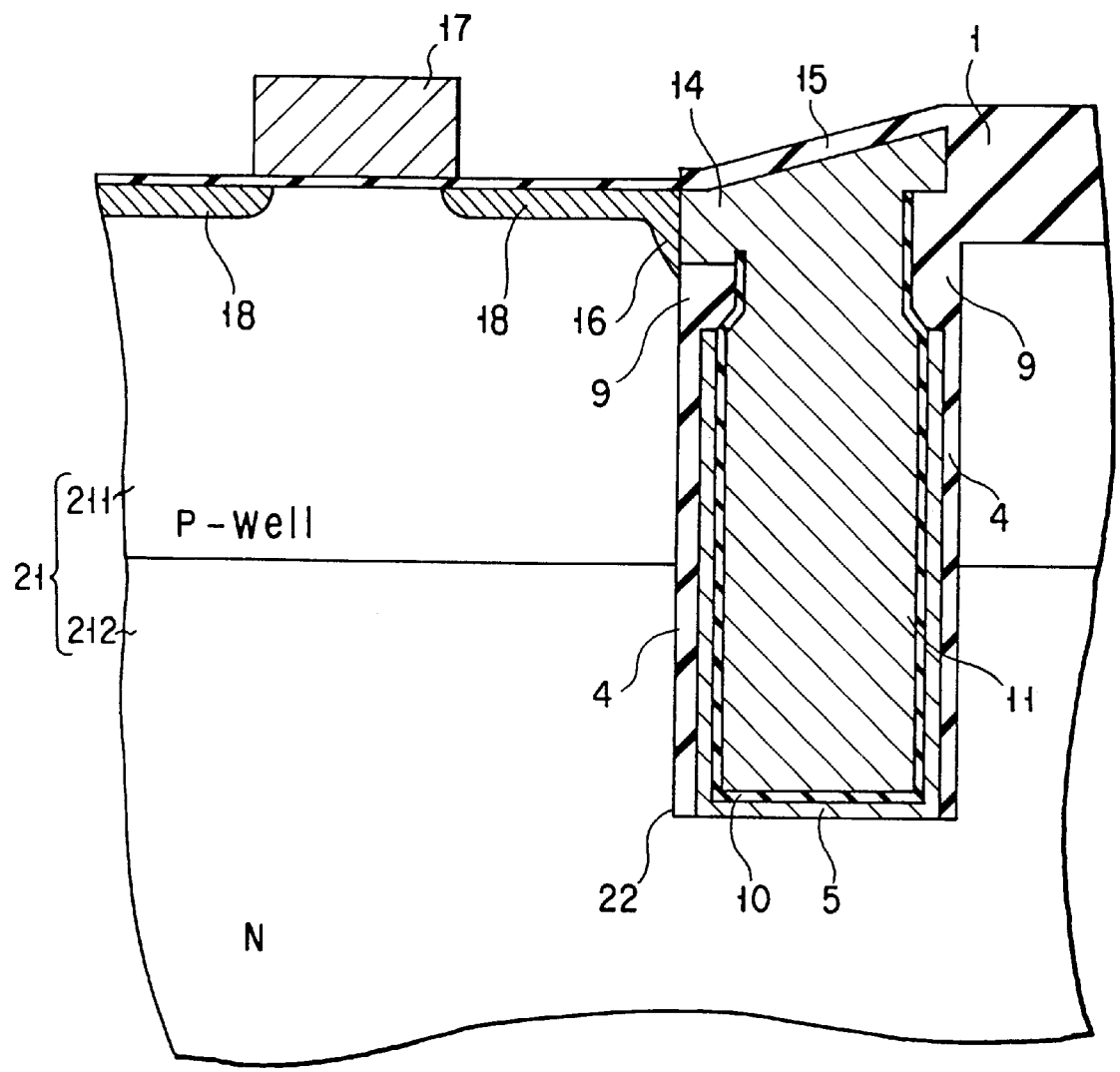
FIG. 15 is a cross sectional view, showing a first structure of the substrate of a sheath-plate type trench capacitor of a DRAM corresponding to the DRAM of FIG. 2 but more specific than the same.
Figure 16:
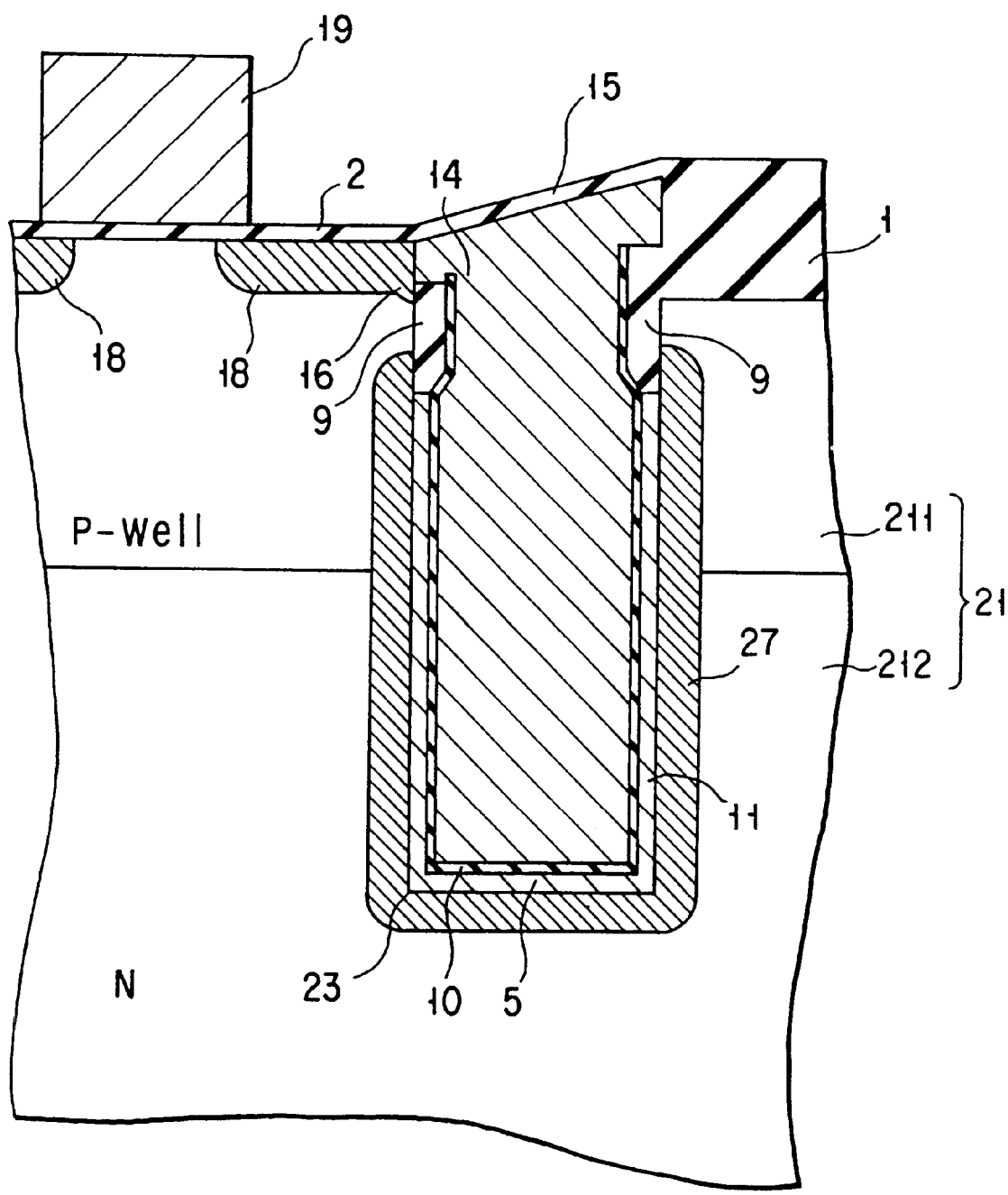
FIG. 16 is a cross sectional view, showing a first structure of the substrate of a sheath-plate type trench capacitor of a DRAM corresponding to the DRAM of FIG. 7 but more specific than the same.
Figure 17:
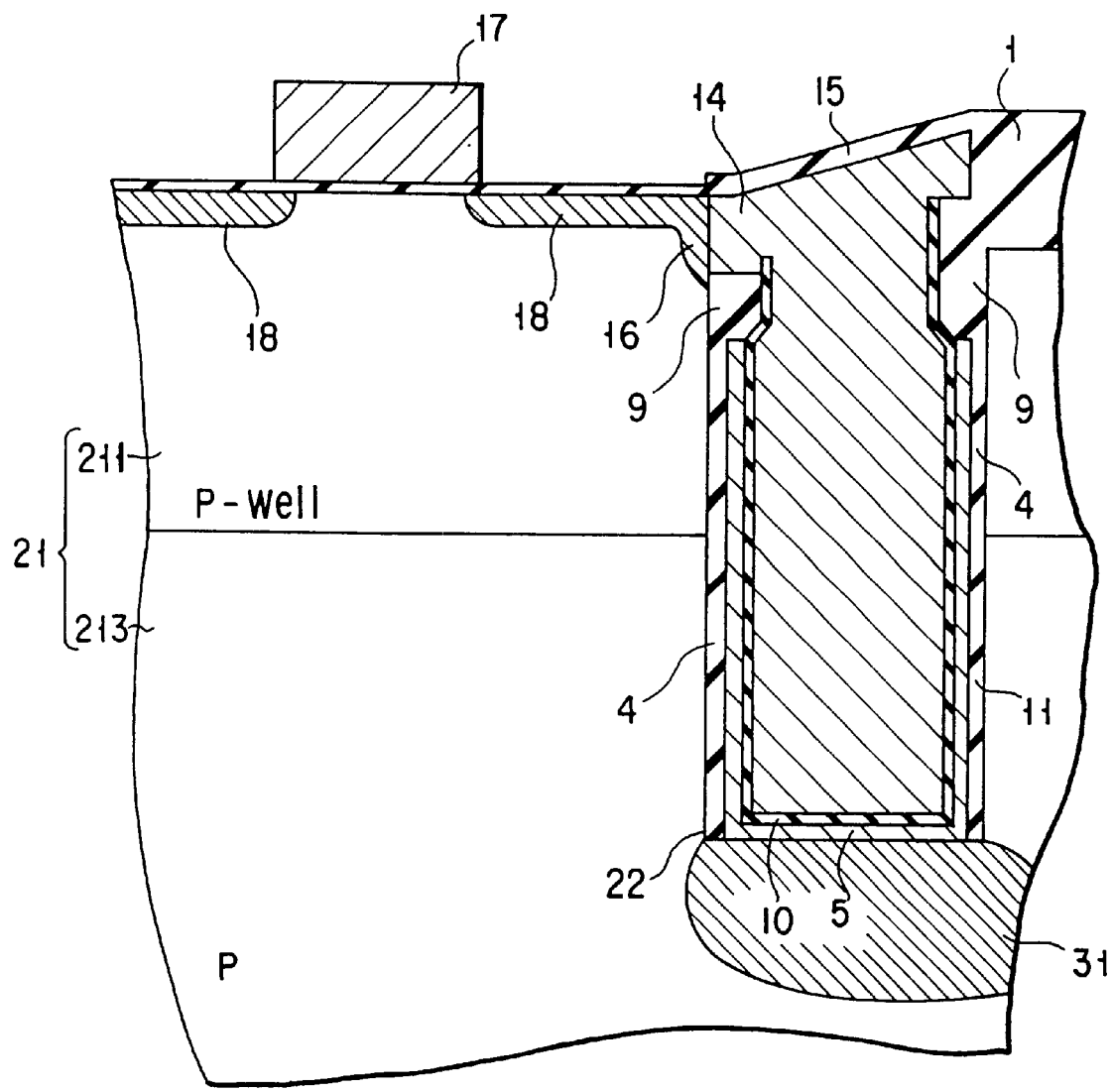
FIG. 17 is a cross sectional view, showing a second structure of the substrate of a sheath-plate type trench capacitor of a DRAM corresponding to the DRAM of FIG. 2 but more specific than the same.
Figure 18:
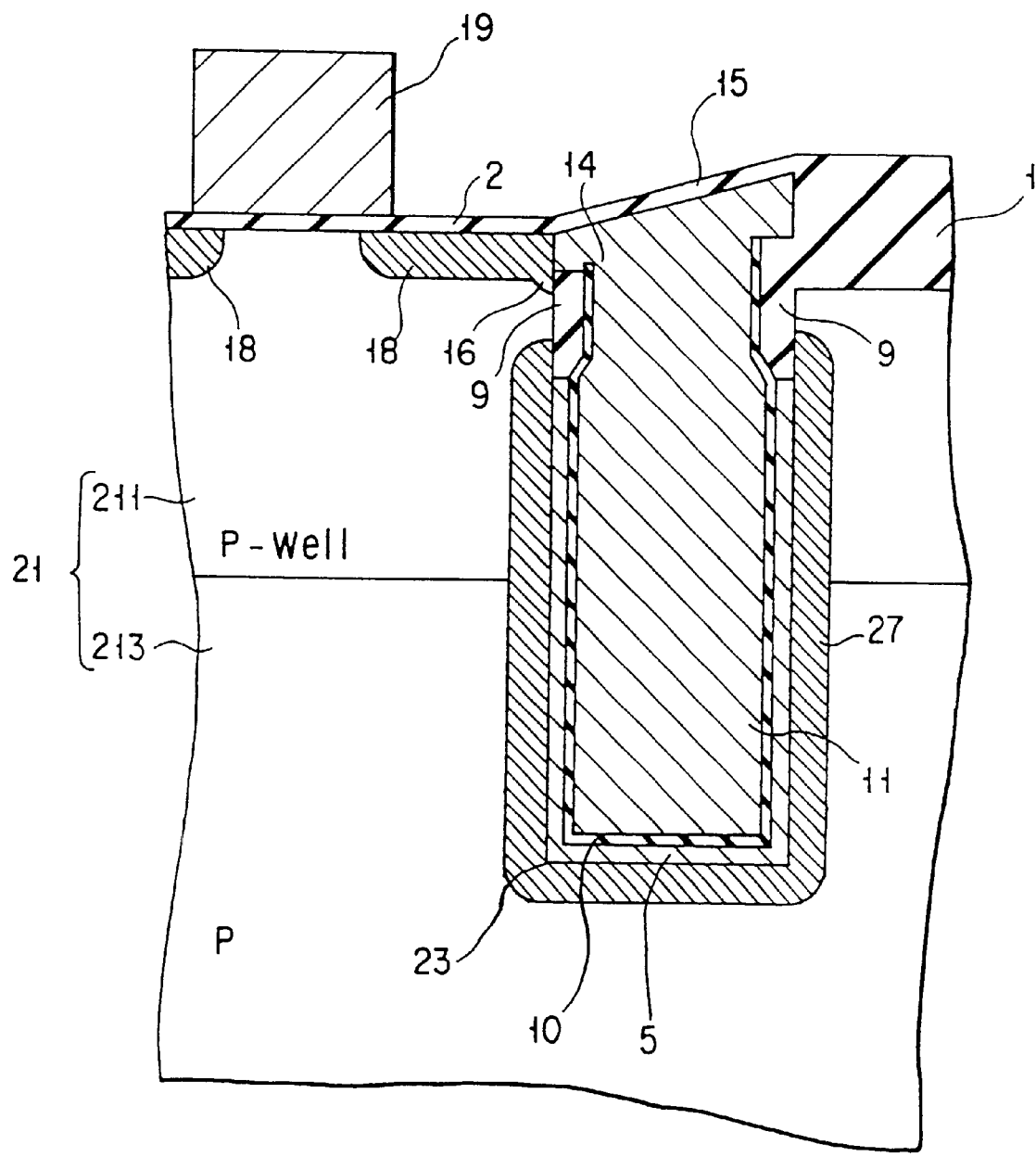
FIG. 18 is a cross sectional view, showing a second structure of the substrate of a sheath-plate type trench capacitor of a DRAM corresponding to the DRAM of FIG. 7 but more specific than the same.

In the above embodiments, the monocrystal silicon semiconductor substrate 21 may be a p-type well region 211 formed on an n-type substrate 212 as shown, for example, in FIG. 15 corresponding to FIG. 2 or FIG. 16 corresponding to FIG. 7; or may be a p-type region 211 formed on a p-type substrate 213 as shown, for example, in FIG. 17 corresponding to FIG. 2 or FIG. 18 corresponding to FIG. 7. In the latter case shown in FIG. 17, an n-type region 31 for supplying a potential and connecting another trench (not shown) is provided in the p-type substrate 213 such that it contacts the polysilicon film 5 serving as a first capacitor electrode. The diffusion layer 27 as shown in FIGS. 7, 12 and 18 has the same function as the n-type region 31 mentioned above. The n-type region 31 may be a diffusion layer formed by diffusing an impurity from the bottom of the trench to the substrate, or may be a diffusion layer beforehand embedded in the substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device including a trench capacitor comprising:

a semiconductor substrate;

a trench formed in a surface portion of said semiconductor substrate;

an insulating film formed on an upper sidewall portion of said trench;

a capacitor insulating film formed in said trench;

a conductive film formed on said capacitor insulating film in said trench; and a diffusion region formed in said semiconductor substrate such that said diffusion region is provided opposite to said conductive film with respect to said capacitor insulating film, and located substantially below said insulating film, wherein said insulating film projects inward of said trench such that an inside diameter of said insulating film is smaller than an inside diameter of said diffusion region, and an outside diameter of said insulating film is larger than an inside diameter of said diffusion region.

2. A semiconductor device according to claim 1, wherein said capacitor insulating film extends onto said insulating film.

3. A semiconductor device according to claim 1, wherein said insulating film is oxidation film.

4. A semiconductor device including a trench capacitor comprising:

a semiconductor substrate;

a trench formed in a surface portion of said semiconductor substrate;

an insulating film formed on an upper sidewall portion of said trench;

a capacitor insulating film formed in said trench; and a first capacitor electrode formed on said capacitor insulating film in said trench; and a second capacitor electrode formed opposite to said first capacitor electrode with respect to said capacitor insulating film, wherein said insulating film projects inward of said trench such that an inside diameter of said insulating film is smaller than an inside diameter of said second capacitor electrode, and an outside diameter of said insulating film is always larger than an inside diameter of said second capacitor electrode.

5. A semiconductor device according to claim 4, wherein said capacitor insulating film extends onto said insulating film.

6. A semiconductor device according to claim 4, wherein an inside diameter of said insulating film is smaller than an inside diameter of said trench.

7. A semiconductor device according to claim 4, wherein said second capacitor electrode is formed in said semiconductor substrate such that said second capacitor electrode is located substantially below said insulating film.

8. The semiconductor device according to claim 4, wherein said second capacitor electrode is located only around a periphery of sidewall and bottom portions of said trench.

9. A semiconductor device according to claim 4, wherein said first capacitor electrode is a capacitor storage node of said trench capacitor, and said second capacitor electrode is a capacitor plate electrode of said trench capacitor.

10. A semiconductor device according to claim 4, wherein said insulating film is oxidation film.

11. A semiconductor device including a trench capacitor comprising:

a semiconductor substrate;

a trench formed in a surface portion of said semiconductor substrate;

an insulating film formed on an upper sidewall portion of said trench;

a capacitor insulating film formed on a lower sidewall portion of said trench, said capacitor insulating film extending onto said insulating film;

a first capacitor electrode formed on said capacitor insulating film in said trench; and a second capacitor electrode formed opposite to said first capacitor electrode with respect to said capacitor insulating film, wherein said insulating film projects inward of said trench such that an inside diameter of said insulating film is smaller than an outside diameter of said first capacitor electrode, and an outside diameter of said insulating film is always larger than an outside diameter of said first capacitor electrode.

12. A semiconductor device according to claim 11, wherein an inside diameter of said insulating film is smaller than an inside diameter of said lower sidewall portion of said trench.

13. A semiconductor device according to claim 11, wherein said second capacitor electrode is formed in said semiconductor substrate such that said second capacitor electrode is located substantially below said insulating film.

14. A semiconductor device according to claim 11, wherein said first capacitor electrode is a capacitor storage node of said trench capacitor, and said second capacitor electrode is a capacitor plate electrode of said trench capacitor.

15. A semiconductor device according to claim 11, wherein said insulating film is oxidation film.

16. A semiconductor device including a trench capacitor comprising:

a semiconductor substrate;

a trench formed in a surface portion of said semiconductor substrate;

an insulating film formed on an upper sidewall portion of said trench;

a capacitor insulating film formed on a lower sidewall portion of said trench, said capacitor insulating film extending onto said insulating film;

a first capacitor electrode formed on said capacitor insulating film in said trench, wherein said first capacitor electrode is a capacitor storage node of said trench capacitor; and a second capacitor electrode formed opposite to said first capacitor electrode with respect to said capacitor insulating film, wherein said second capacitor electrode is a capacitor plate electrode of said trench capacitor and said insulating film is smaller than an inside diameter of said capacitor insulating film formed on a lower sidewall portion of said trench.

17. A semiconductor device according to claim 16, wherein said insulating film is oxidation film.

18. A semiconductor device according to claim 16, wherein an inside diameter of said insulating film is smaller than an inside diameter of said lower sidewall portion of said trench.

19. A semiconductor device according to claim 16, wherein said second capacitor electrode is formed in said semiconductor substrate such that said second capacitor electrode is located substantially below said insulating film.

20. A semiconductor device including a trench capacitor comprising:

a semiconductor substrate;

a trench formed in a surface portion of said semiconductor substrate;

a layer formed on a sidewall of said trench and comprising a conductive portion formed on a lower sidewall portion of said trench and an insulating portion formed on an upper sidewall portion of said trench, said conductive portion constituting a first capacitor electrode which is physically connected to said semiconductor substrate and said insulating portion projecting inward of said trench such that an inside diameter of said insulating portion is smaller than an inside diameter of said first capacitor electrode;

a capacitor insulating film coated on said first capacitor electrode; and a second capacitor electrode formed in said trench such that it contacts said capacitor insulating film.

21. The semiconductor device according to claim 20, wherein said conductive portion is substantially located below said insulating portion.

22. A semiconductor device according to claim 20, wherein said insulating portion is oxidation film.

23. A semiconductor device including a trench capacitor comprising:

a semiconductor substrate;

a trench formed in a surface portion of said semiconductor substrate;

an insulating film formed on an upper sidewall portion of said trench; and a diffusion region formed in said semiconductor substrate outside of said trench, and located substantially below said insulating film, wherein said insulating film projects inward of said trench such that an inside diameter of said insulating film is smaller than an inside diameter of said diffusion region, and an outside diameter of said insulating film is larger than an inside diameter of said diffusion region.

24. A semiconductor device according to claim 23, wherein said insulating film is oxidation film.

25. A semiconductor device including a trench capacitor comprising:

a semiconductor substrate;

a trench formed in a surface portion of said semiconductor substrate;

an insulating film formed on an upper sidewall portion of said trench;

a diffusion region formed in said semiconductor substrate outside of said trench, and located substantially below said insulating film, wherein said diffusion region is a capacitor plate electrode;

a capacitor insulating film formed on the diffusion region; and a storage node formed opposite to said capacitor plate electrode with respect to said capacitor insulating film;

wherein said insulating film projects inward of said trench such that an inside diameter of said insulating film is smaller than an inside diameter of said diffusion region.

* * * * *

UNITED STATES PATENT AND TRADEMARK OFFICE
CERTIFICATE OF CORRECTION

PATENT NO. : 6,534,814 B2 Page 1 of 1
DATED : March 18, 2003
INVENTOR(S) : Junichiro Iba et al.

It is certified that error appears in the above-identified patent and that said Letters Patent is hereby corrected as shown below:

Column 9,
Line 48, please replace "said insulating film is smaller" with -- an inside diameter of said insulating film is smaller --.

Signed and Sealed this

Fifteenth Day of November, 2005

JON W. DUDAS
*Director of the United States Patent and Trademark Office*